US008516356B2

(12) United States Patent
Brewerton et al.

(10) Patent No.: US 8,516,356 B2
(45) Date of Patent: Aug. 20, 2013

(54) REAL-TIME ERROR DETECTION BY INVERSE PROCESSING

(75) Inventors: Simon Brewerton, Trowbridge (GB); Neil Hastie, Lydney Gloucestershire (GB)

(73) Assignee: Infineon Technologies AG, Neubiberg (DE)

( * ) Notice: Subject to any disclaimer, the term of this patent is extended or adjusted under 35 U.S.C. 154(b) by 394 days.

(21) Appl. No.: 12/839,503

(22) Filed: Jul. 20, 2010

(65) Prior Publication Data

US 2012/0023389 A1  Jan. 26, 2012

(51) Int. Cl.
*G01R 31/28* (2006.01)
*G06F 11/00* (2006.01)
*G06F 9/455* (2006.01)
*G06F 17/50* (2006.01)

(52) U.S. Cl.
USPC ............ 714/823; 714/741; 716/106; 716/107; 716/112

(58) Field of Classification Search
None
See application file for complete search history.

(56) References Cited

U.S. PATENT DOCUMENTS

| | | | |
|---|---|---|---|
| 4,296,494 A * | 10/1981 | Ishikawa et al. | ............. 714/6.1 |
| 4,799,155 A | 1/1989 | Wilson | |
| 5,506,792 A | 4/1996 | Adelson | |
| 6,223,337 B1 | 4/2001 | Blume | |
| 6,230,252 B1 | 5/2001 | Passint | |
| 6,690,733 B1 * | 2/2004 | Baumgartner et al. | ....... 375/259 |
| 6,839,868 B1 | 1/2005 | Pignol | |
| 7,058,929 B2 | 6/2006 | Charnell | |
| 7,146,530 B2 | 12/2006 | Pomaranski | |
| 7,213,168 B2 | 5/2007 | Kalan | |
| 7,243,262 B2 | 7/2007 | Mukherjee | |
| 7,386,839 B1 | 6/2008 | Golender | |
| 7,468,923 B2 * | 12/2008 | Ishimaru | ............. 365/189.11 |
| 7,484,152 B2 | 1/2009 | Bancel | |
| 7,543,221 B2 | 6/2009 | Mukherjee | |
| 7,694,156 B2 * | 4/2010 | Gammel et al. | ............. 713/194 |
| 2001/0034827 A1 | 10/2001 | Mukherjee | |
| 2001/0037445 A1 | 11/2001 | Mukherjee | |

(Continued)

FOREIGN PATENT DOCUMENTS

| | | |
|---|---|---|
| EP | 372579 | 6/1990 |
| JP | A 2008-262557 | 10/2008 |
| WO | WO 00/22529 | 4/2000 |
| WO | WO 2005/066784 | 7/2005 |

OTHER PUBLICATIONS

Bernadi et al., *A New Hybrid Fault Detection Technique for Systems-on-a-Chip*, IEEE Computer Society, pp. 185-198, vol. 55, No. 2, Feb. 2006.

(Continued)

*Primary Examiner* — Guerrier Merant
(74) *Attorney, Agent, or Firm* — Patterson Thuente Pedersen P.A.

(57) ABSTRACT

Processors, microprocessors and logical block systems and methods, error detection systems and methods, and integrated circuits are disclosed. In an embodiment, a logic-based computing system includes a first processing core; a second processing core generated from the first processing core and including an inverted logical equivalent of the first processing core such that an output of the second processing core is a complement of an output of the first processing core; and comparator logic coupled to receive the outputs of the first and second processing cores as inputs and provide an error output if the output of the second processing core is not the complement of the output of the first processing core.

27 Claims, 7 Drawing Sheets

(56) References Cited

U.S. PATENT DOCUMENTS

| | | |
|---|---|---|
| 2001/0037448 A1 | 11/2001 | Mukherjee |
| 2002/0023202 A1 | 2/2002 | Mukherjee |
| 2003/0005380 A1 | 1/2003 | Nguyen |
| 2005/0138478 A1 | 6/2005 | Safford |
| 2005/0138485 A1 | 6/2005 | Osecky |
| 2005/0154944 A1 | 7/2005 | Reinhardt |
| 2006/0101433 A1 | 5/2006 | Opem |
| 2007/0147138 A1* | 6/2007 | Ishimaru ................ 365/189.05 |
| 2007/0189536 A1* | 8/2007 | Gammel et al. ............ 380/259 |
| 2008/0016393 A1 | 1/2008 | Bose |
| 2008/0282257 A1 | 11/2008 | Wang |
| 2009/0217249 A1 | 8/2009 | Kim |

OTHER PUBLICATIONS

Subramanyan et al, "Power Efficient Redundant Execution for Chip Multiprocessors", Jun. 2009, Workshop on Dependable and Secure Nanocomputing, six pages.

Granston et al., "Detecting Redundant Accesses to Array Data", 1991, Supercomputing 91' Proceedings of the 1991 ACM/IEEE conference on Supercomputing, pp. 854-855

Orcheretny, Vitaly, *Self-checking Arithmetic Logic Unit with Duplicated Outputs*. On-Line Testing Symposium (IOLTS). 2010 IEEE 16$^{th}$ International, Jul. 2010, pp. 202-203.

Vasudevan, Dilip P., *Self-Checking Carry-Select Adder Design Based on Two-Rail Encoding*. Circuits and Systems I: Regular Papers, IEEE Transactions on 2007, pp. 2696-2705.

* cited by examiner

REAL-TIME ERROR DETECTION BY INVERSE PROCESSING

TECHNICAL FIELD

The invention relates generally to processors and microprocessors and more particularly to processing arrangements that can be used for real-time error detection and has applicability in safety critical or high integrity systems.

BACKGROUND

High integrity software has become commonplace in a variety of wide-ranging applications. For example, many automotive, banking, aerospace, defense, Internet payment, and other applications have critical paths that require validation of safe operation by means of redundancy, diversity or both.

The general approach of guaranteeing safe operation of a critical path is for two algorithms to be computed and the results compared for consistency or plausibility using an independent comparator. Generally, this has been implemented via two different methods. First, on a system that is limited to one active processing channel, two (or more) diverse algorithms can be computed with temporal separation. These results are then cross-checked for consistency or plausibility. Second, on a system with more than one processing channel, identical algorithms can be computed simultaneously, with one algorithm processed on a processing channel (a "core"), and the results compared for consistency. A common subset of the second method is the approach of computing one algorithm on two redundant processing channels, whereby the two processing channels are temporally separated (typically by a few clock cycles). This subset method is desirable because it can be robust against hard and soft error events, such as a disturbance arising from a common cause event, for example an alpha particle strike, because of the slight temporal separation. The hope is that the common cause event would disturb one processing channel in such a way that the computed output differs from the other processing channel. The outputs to these channels are compared by a simple comparator, which can trigger an error event, if necessary.

There are several drawbacks to the temporally-separated multiple processing channel implementation. Delaying the input process into the checker core and the output from the primary core requires a large amount of processing state to be held, which costs silicon area and power. Additionally, the number of delay states required to maintain temporal separation increases as the frequency of implementation increases. Again, more delay states cost additional silicon area and power. Further, the data used by the respective computations must be protected against corruption. Also, the comparator used to check the outputs must be shown to be independent from any common cause failures of the processing channels. The quality of the comparison becomes software dependent because it relies on a disturbance of one processing channel to be different from another processing channel, but ultimately depends on the actual processing state of the machines.

In addition to these concerns, perhaps the most crucial issue in implementation is making the actual executions of the two processing channels as maximally diverse as possible, in order to reduce common cause failures. To guarantee integrity, the application must show that each processing channel is independent, such that common cause failures are minimized and that a failure in one channel does not affect the other(s). Efforts to provide diversity include, among others: using different aspect rations for the silicon areas, using rotated macros of the designs, physically separating the instances, and targeting different process speeds of the actual cores. However, none of these efforts provide guaranteed, complete coverage.

SUMMARY

Processors, microprocessors and logical block systems and methods, error detection systems and methods, and integrated circuits are disclosed. In an embodiment, a logic-based computing system comprises a first processing core; a second processing core generated from the first processing core and comprising an inverted logical equivalent of the first processing core such that an output of the second processing core is a complement of an output of the first processing core; and comparator logic coupled to receive the outputs of the first and second processing cores as inputs and provide an error output if the output of the second processing core is not the complement of the output of the first processing core.

In an embodiment, an integrated circuit comprises a first microprocessor having an output; a second microprocessor created from the first microprocessor and comprising an inverted logical equivalent of the first microprocessor, the second microprocessor having an output; and a comparator circuit coupled to the outputs of the first microprocessor and the output of the second microprocessor and configured to compare the outputs and provide an error output if the output of the second microprocessor core is not the complement of the output of the first microprocessor core.

In an embodiment, a method of creating a diverse logical block comprises creating a high-level language description of a logical block; and for a first instance of the language description, performing a first logic synthesis of the language description and executing a diverse microprocessor-generating script, performing a second logic synthesis and optimization, generating a logic gate-level netlist, and generating a technology-specific layout.

In an embodiment, a method of real-time error detection in a processor comprises executing an instruction by a first processor; executing an instruction by a second processor; comparing a result of the first processor and the second processor; and detecting an error if the result of the second processor is not the complement of the first processor.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Systems and methods relating to a real-time error detection utilizing inverse processing are disclosed. In an embodiment, an autonomous, automated process creates a diverse processing core from a single description of a main core. The diverse processing core is as diverse as possible, yet remains logically equivalent to the main core. When the two processing cores execute a common algorithm, errors can be detected by a comparator system because of the inherent relatedness between the two implementations. Errors can be detected by periodically comparing the output of the diverse processing core to that of the main processing core.

Logical equivalence between the main core and the diverse core is achieved in an embodiment such that every internal state of the diverse core is stored as a complement to the main core, every internal clock edge is inverted relative to the main core, the inputs to the diverse core are doubly inverted relative to the main core, the outputs of the diverse core are inverted relative to the main core, the logical state of the diverse core is always the inverse to the processing core, and no temporal separation between the algorithm execution on the cores is required. An embodiment may use only a subset of the available internal state as a basis for comparisons, while another embodiment can include a temporal separation for the processing channels or comparator mechanisms, and still another embodiment can use offline storage of available states, with or without compression, for future processing and comparison.

The comparator system can be implemented with knowledge that suitable logical comparators of the respective state vector elements in each implementation are always complementary. Because the diverse core creates an inverted output from the main core, an "exclusive or" (XOR)-type comparator can be utilized in an embodiment. In such an implementation, the comparator returns TRUE if exactly one of the operands has a value of TRUE. In other words, the comparator detects a fault if the output differs in one or the other but not both.

Creating diversity and using a comparator system in this way offers many benefits. Primarily, the system achieves robustness against common cause events. Further, this diversity reduces the number of delay states required to be held to be robust against hard and soft errors, thus reducing the amount of silicon area and power needed. Additionally, there is no need to protect stored data against corruption, as there is minimal stored data—both cores take the same inputs, and outputs of the two channels can be compared immediately, once available. Unlike time-shifted redundant processing channel implementations, there is no dependence of the diagnostic coverage from the instructions flow in the main processing channel. Also, use of the XOR-type comparator gives the benefit of each state change of the cores being reported as diverse signal levels, so common failures in the signal routing, like open, shorted, or crossed connections, can be easily detected. Permanent faults on the state vector wiring and logic can likewise be detected. Use of an inverted clock in the diverse core implementation also permits the detection of clock glitches that affect either rising or falling edges, but not both at the same time, as the diverse core will be disturbed in a different way or not at all.

In another embodiment, N diverse cores are created from a main core. When the main core, along with the N diverse cores, execute a common algorithm, errors can be detected by a comparator system similar to that described above, but scaled for N diverse cores. Thus, depending on the level of diagnostic coverage desired, embodiments are infinitely scalable, limited only by the resources of the target hardware. The use of N>2 embodiments also permits further logical processing to discover the erroneous channel and permit fail operational behaviors and error correction.

Embodiments can relate to microprocessors and microprocessing systems as well as any logical block that can be described as a high-level language description, such that further processing, such as by a script, can translate the description to the maximally diverse equivalent. Such logical blocks can include but are not limited to co-processors, peripherals, memory controllers, digital signal processors, communication interfaces and graphics engines, among others, as appreciated by those having skill in the art. Use of the term "microprocessor" may refer to an embodiment but is not generally to be limited to microprocessors per se in all instances.

Figure 1:
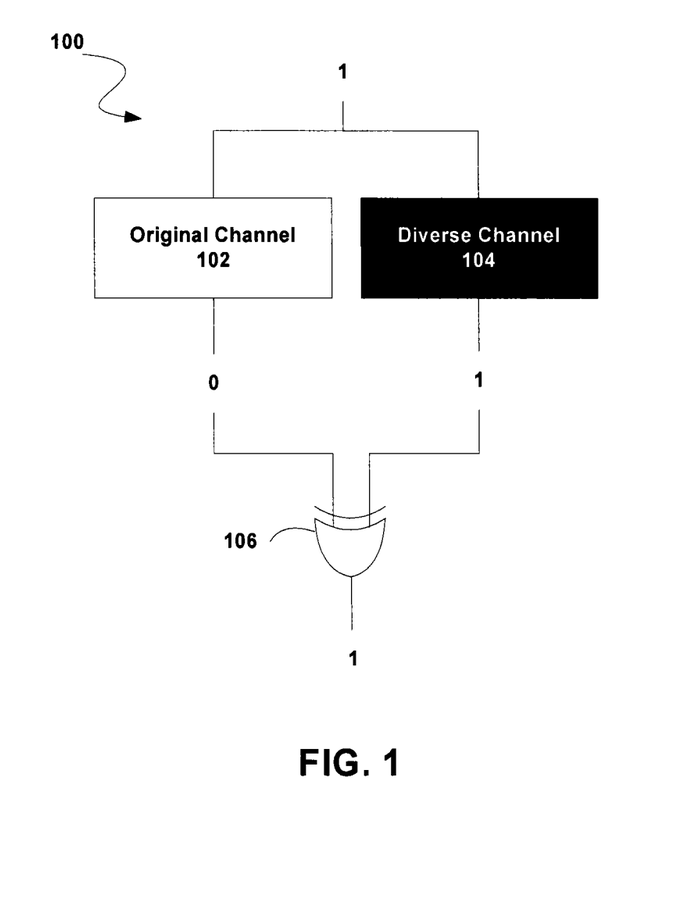
FIG. 1 depicts a conceptual block diagram of a processing system according to an embodiment.

Referring to the drawings, FIG. 1 is a generalized conceptual block diagram of a processing system 100 having inverse processing according to an embodiment. System 100 comprises an original processing channel 102 and a diverse processing channel 104. If an input to system 100 is a logic "1" and an output of original channel 102 is a logic "0," an output of diverse channel 104 will be the inverse of original channel 102 absent any errors in system 100. Thus, in the example of FIG. 1, the output of diverse channel 104 is a logic "1." An XOR gate 106 compares the outputs of original channel 102 and diverse channel 104, and here provides an output of "1" given that the inputs do not match. This result indicates no errors occurred, as a mismatched result is desired given the inverse relationship of channels 102 and 104. An output of "0" would occur if the outputs of channels 102 and 104 match, which would indicate an error or failure.

In an embodiment, original processing channel 102 can be defined in VHDL (very-high-speed-integrated-circuit hardware description language), Verilog or some other suitable logical description as understood by one having skill in the art, such that the definition of channel 102 can be interpreted and transformed into a physical layout on silicon using suitable logic synthesis and physical layout tools. The definition of diverse processing channel 104 can then be obtained by processing original processing channel 102's VHDL prior to logic synthesis. In an embodiment, diverse channel 104 is defined according to the following with respect to original channel 102: diverse state storage; diverse logic implementation; diverse clocking; diverse outputs; and diverse layout.

Figure 2A:
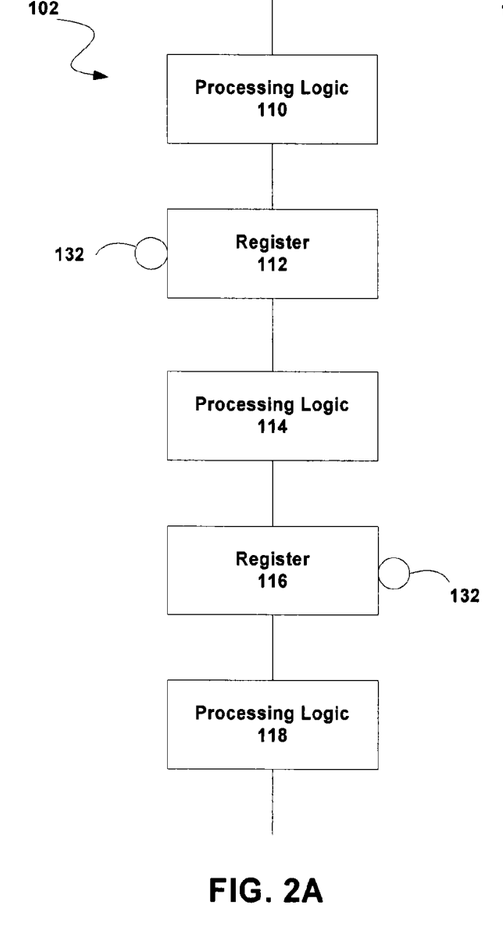
FIG. 2A depicts a block diagram of an original processing channel according to an embodiment.
Figure 2B:
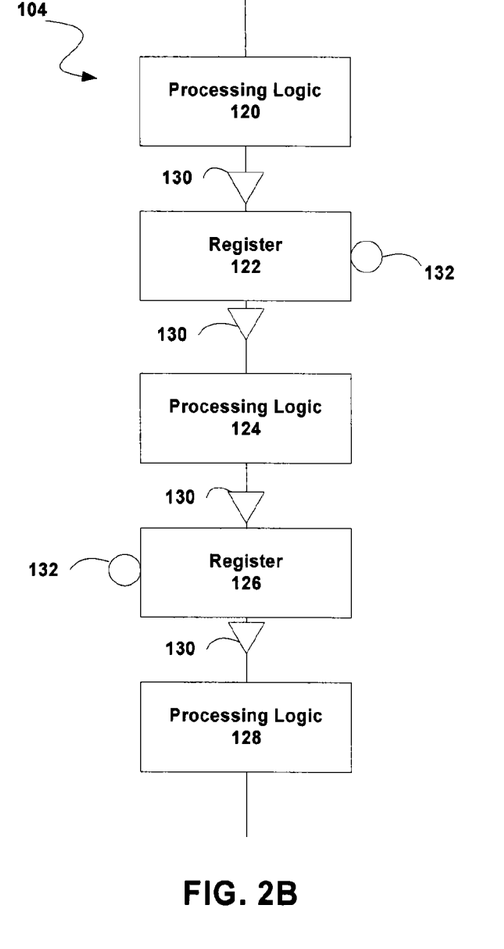
FIG. 2B depicts a block diagram of a diverse processing channel with inverted state inputs and inverted state outputs according to an embodiment.

FIG. 2 depicts block diagrams related to diverse state storage, including the inversion of internal state register inputs, outputs and reset states according to an embodiment. FIG. 2A depicts an original processing channel 102 according to an embodiment, while FIG. 2B depicts a block diagram of a diverse processing channel 104 according to an embodiment. Original processing channel 102 includes processing logic 110, 114 and 118 interspersed with registers 112 and 116 in an embodiment. Channel 102 is but one example, and other embodiments can have more or fewer processing logic blocks and/or registers, as well as similar or different arrangements, as understood by one having skill in the art.

Diverse processing channel 104 also includes processing logic blocks 120, 124 and 128 and registers 122 and 126 in an embodiment. Channel 104 can also comprise varying compositions and configurations in accordance with the composition and configuration of channel 102, as previously mentioned. In contrast with channel 102, however, channel 104 comprises inverters 130 such that all inputs and outputs of registers 122 and 126 are inverted. Additionally, reset states 132 of registers 122 and 126 are inverted with respect to those of registers 112 and 116.

Figure 3A:
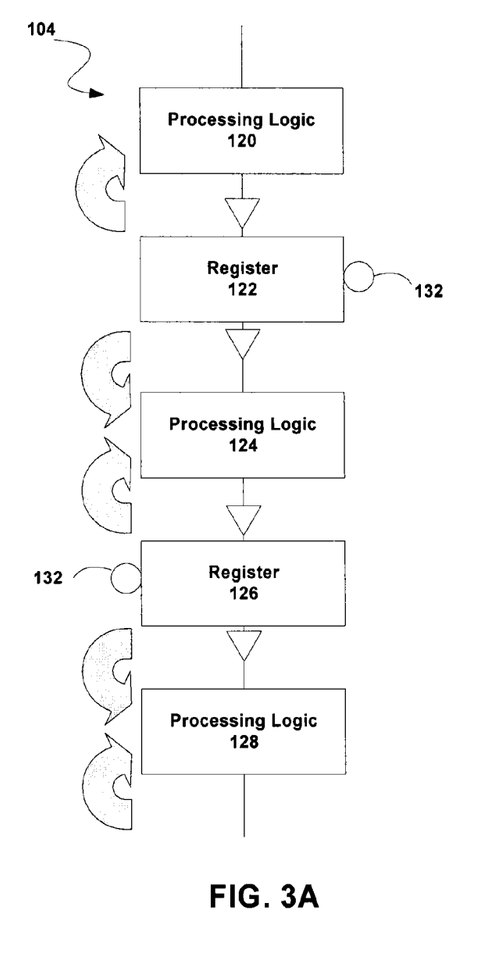
FIG. 3A depicts a block diagram of a diverse processing channel with respect to inverted logic implementation according to an embodiment.

FIG. 3 depicts block diagrams related to diverse logic implementation according to an embodiment. FIG. 3A depicts diverse processing channel 104 of FIG. 2B, after inversion of the internal state register inputs, outputs and reset states as discussed above. A next step in generating the final diverse processing channel 104 is to diversify the logic implementation in an embodiment. The description herein of the order of steps in generating a final diverse processing channel 104 relates to but one embodiment, and the order or other details of the generation can vary in other embodiments. The arrows in FIG. 3A refer to a merging of state inverters 130 with the existing processing logic clouds or blocks 120, 124 and 128. In an embodiment, the input to processing logic 120 is double-inverted (not depicted), and one or both inverters can be merged with processing logic 120 in various embodiments. Keeping one of the inverters as a discrete inverter can help to ensure that the input logic has a diverse implementation. Though not depicted, registers 122 and 126 can also include resets which can be inverted though are not required to be so long as the active state is active low in embodiments. Re-optimization of processing logic 120, 124 and 128 can also be performed in an embodiment. Additionally, diversity can be further increased in embodiments by carrying out other logic diversification and/or optimization processes, such as selectively excluding library cells at logic synthesis.

Figure 3B:
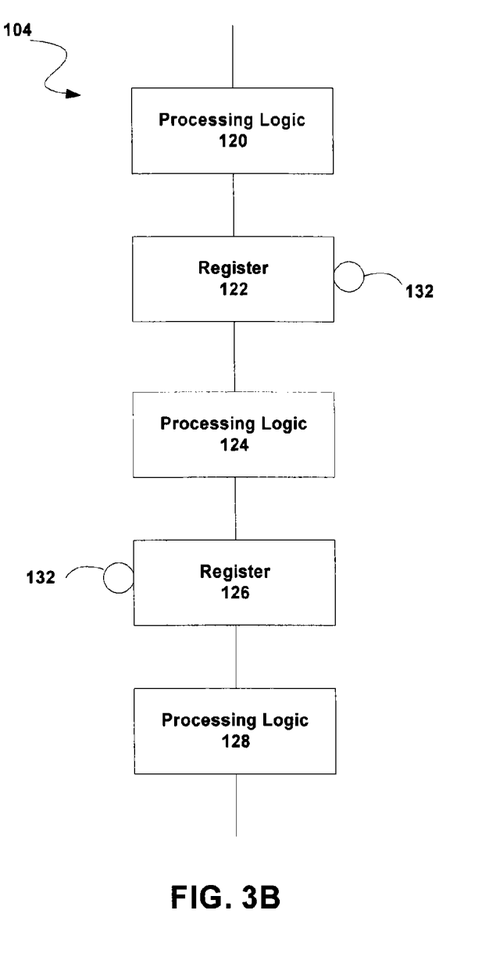
FIG. 3B depicts a block diagram of the resulting implementation of FIG. 2A according to an embodiment.
Figure 4A:
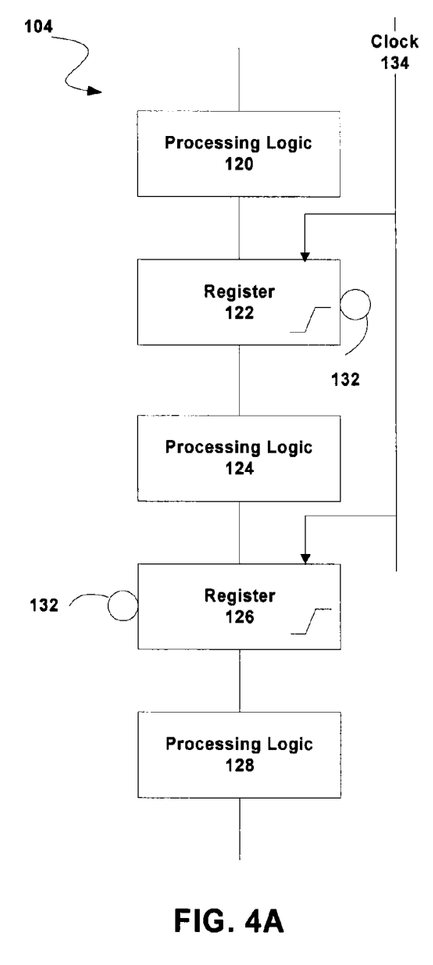
FIG. 4A depicts a block diagram of an original processing channel with respect to clock input according to an embodiment.
Figure 4B:
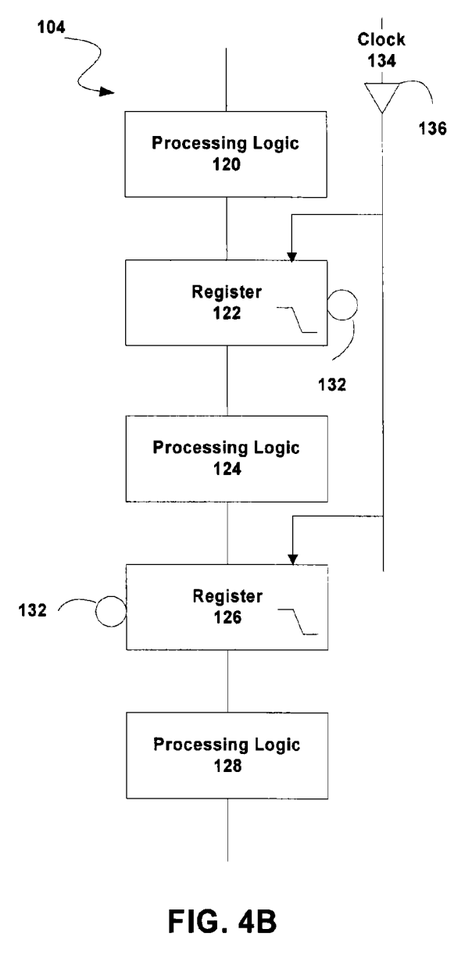
FIG. 4B depicts a block diagram of a diverse processing channel with inverted clock input according to an embodiment.

FIG. 4 depicts block diagrams related to diverse clocking. Diverse processing channel 104 after the diverse logic implementation discussed above with reference to FIG. 3 is depicted in FIG. 4A, with the addition of a clock signal 134. To further diversify channel 104 with respect to original channel 102, diverse clocking is implemented in an embodiment. In FIG. 4B, clock signal 134 of diverse channel 104 is inverted at 136, and negative edge clocked registers 122 and 126 are used instead of the positive edge clocked registers 122 and 126 depicted in FIG. 4A.

Figure 5A:
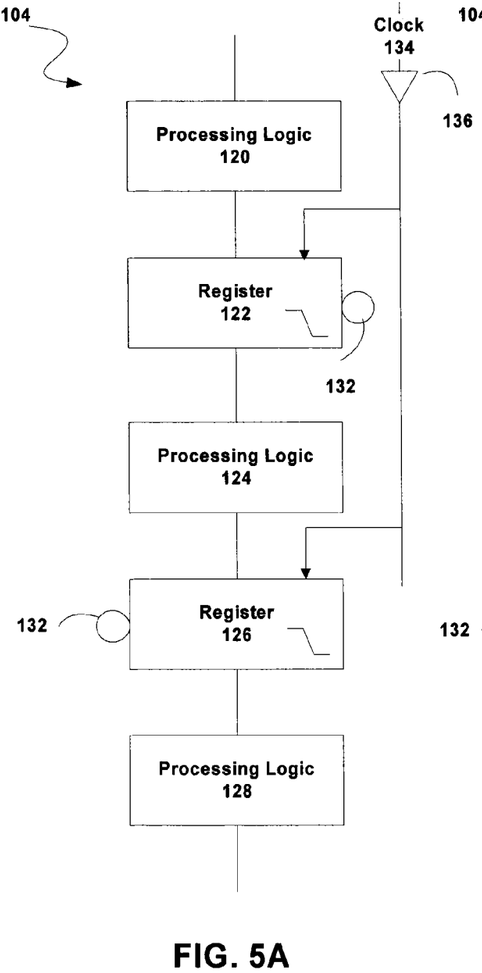
FIG. 5A depicts a block diagram of an original processing channel with respect to output according to an embodiment.
Figure 5B:
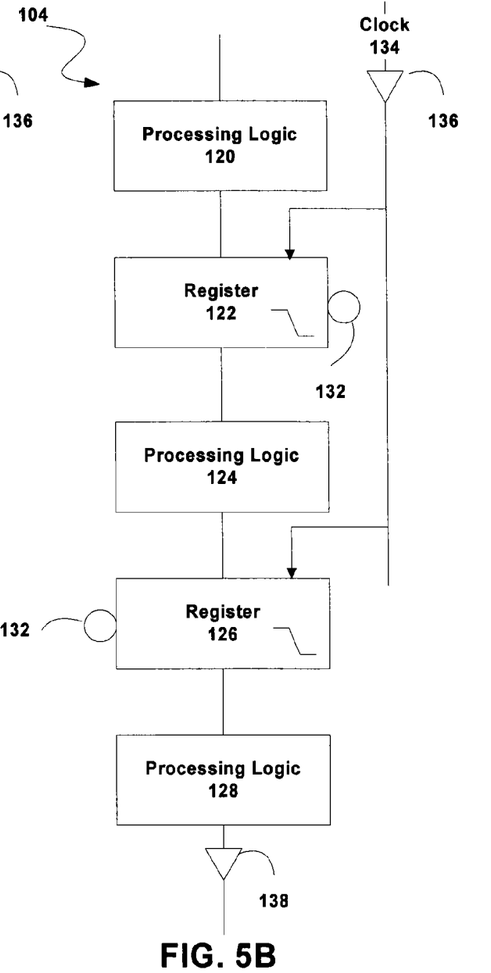
FIG. 5B depicts a block diagram of a diverse processing channel with inverted output according to an embodiment.

Referring to FIG. 5, diverse outputs can also be implemented in embodiments. FIG. 5A depicts diverse processing channel 104 following diverse clocking, as in FIG. 4B. In FIG. 5B, the output of diverse processing channel 104 is inverted at 138.

Figure 6:
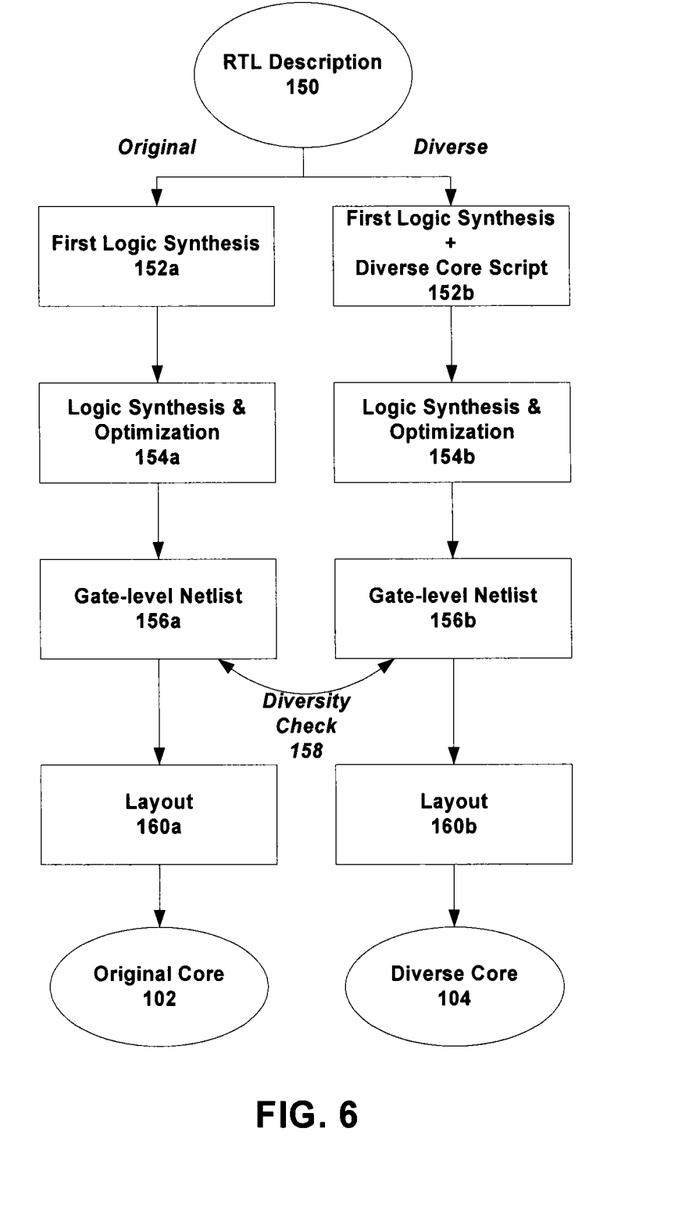
FIG. 6 depicts a block diagram of a design flow according to an embodiment.

In embodiments, the diverse state storage, diverse logic implementation, diverse clocking, diverse outputs and diverse layout are generated automatically within the overall core design flow. Referring to FIG. 6, both the primary or original core and the diverse core are generated from the initial register transfer level (RTL) description 150, for example in VHDL, Verilog or some other suitable format.

At 152a, a first logic synthesis of the original core is performed. In one embodiment, a SYNOPSYS logic synthesis tool is used. At 152b, the same initial logic synthesis of the diverse core is carried out, with the addition of the diverse core-generating script. In a SYNOPSYS embodiment, netlist modifications for the diverse processing channel can be performed at the GTECH stage, or first translation of VHDL or Verilog RTL description input prior to synthesis into technology-defined gates. In other embodiments, other tools and processes can be used, as understood by one skilled in the art. Certain definitions and/or specializations can be used in embodiments in order to force or make simpler the diversification, such as using only Q-output registers in synthesis of both the original and diverse channels, or cores, in order to force a diverse logic implementation.

At 154a and 154b, logic synthesis and optimization can be performed for both the original and diverse cores. In an embodiment, a target cell library and cell exclusion list are implemented at this stage.

At 156a and 156b, gate-level netlists, such as in Verilog or VHDL, are generated, and a diversity check is performed at 158. In an embodiment, the diversity check includes a gate vs. gate comparison of the original and diverse core to ensure that the diverse core is the inverse of the original core (A=IB). Following the layout at 160a and 160b, which can be optimized for frequency and silicon layout, original core 102 and diverse core 104 are generated.

Figure 7:
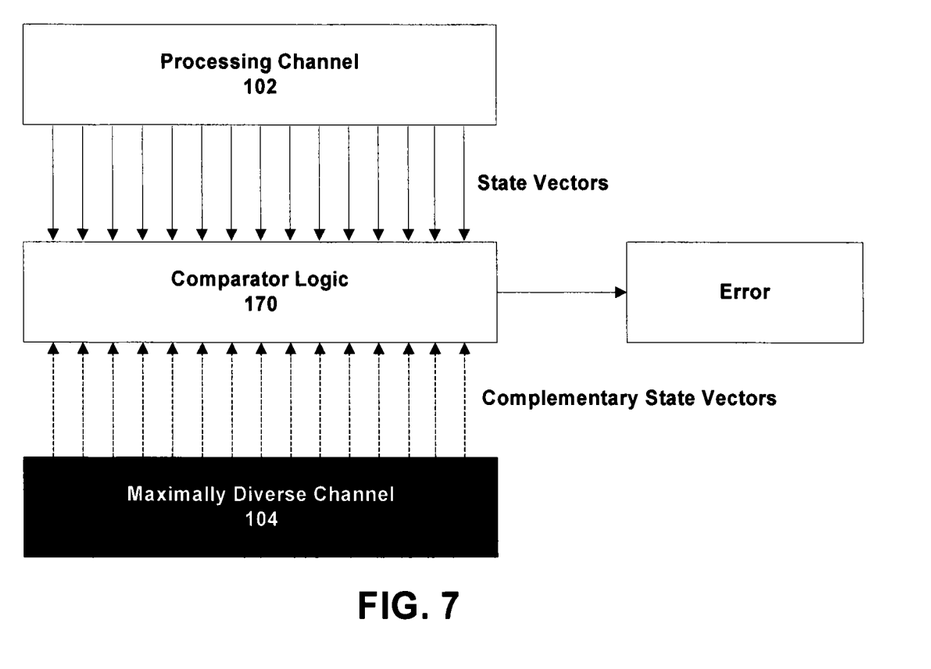
FIG. 7 depicts a block diagram of a comparator system according to an embodiment.

Referring to FIG. 7, and in operation, original processing channel 102 operates in a normal mode, while diverse processing channel 104 operates in a passive shadow or monitoring mode. The states of original processing channel 102 and diverse processing channel 104 can then be compared to ensure the results are complementary, i.e., the inverse of each other. Each state change of each channel 102 and 104, in an embodiment, can be reported as a diverse signal level. In an embodiment, the comparison of the state vectors of processing channel 102 and the complementary state vectors of diverse channel 104 can be carried out by a set of suitable logic comparators 170, such as XOR functions in an embodiment. Comparator logic 170 will thus signal an error 172 in an embodiment whenever one or more of the two complementary state vector elements become equivalent. Use of this inherent complementary coding of the comparator inputs also ensures that cross-connections, open connections and permanent faults on the state vector wiring and logic can also be detected.

Embodiments can be shown to be logically equivalent after the diversification process as the description of both channels is absolute and concise. Formal equivalence tools or other methods can be applied to the netlists and to other layout stages within the flow of the design process to show that equivalences holds for all cases. Equivalence checking proves that the actual layout of the designs and the maximally diverse design are logically correct with respect to each other and to the required timing and signal propagation constraints.

Embodiments can thereby provide a robust, maximally diverse processing channel that can be automatically obtained from an existing design of a processing channel such that disturbances in the processing of either channel can be detected by a simple online state vector comparator to signal an error. In contrast with conventional solutions, the actual diagnostic coverage of embodiments of the maximally diverse processing channel can be determined by simulation, as there is no dependence of the diagnostic coverage from the instructions flow in the main processing channel.

Embodiments can have applicability in high integrity and safety critical applications, including automotive, banking, aerospace, defense, Internet payment, and other applications. For example, specific automotive applications can include braking and speed control, steering, lane-keeping, automatic stopping in response to obstacle detection, hybrid vehicle operation and others, and errors can be caused by environmental factors, electro-static discharge (ESD), physical disturbance and damage and others. While errors or failures can certainly occur in single silicon chips, modern automobiles include a plurality of "networked" chips in a single vehicle. The networking or interoperation of the chips can be difficult to fully vet given the complexity and multiple vendors involved. Therefore, embodiments can have particular applicability in such situations to provide "smart" silicon, enabling quick detection of errors that can, in embodiments, put a system or even an entire vehicle into a "safe" operating mode to avoid catastrophic outcomes.

Embodiments can also have applicability in other computing and processing applications. As size requirements decrease, e.g. transistor size shrinks, disturbances can occur far more easily. To obtain faster computers, redundant logic clouds may be a solution, and embodiments of inverse processing discussed herein can have particular applicability. Embodiments can also have applicability in security systems, such as chipcards and passports, which can be prone to hacking and tampering.

Without limit, references herein to processors and/or microprocessors can refer in embodiments to hardware devices comprising an integrated circuit, application-specific integrated circuit (ASIC) or microchip, operable to execute algorithms, instructions and code. A processor or microprocessor can form part of a computer, and a processor, microprocessor and/or computer can have applicability in various systems, subsystems and devices, including automobiles, aircraft, spacecraft and other vehicles; personal communication and computing devices; mobile phones; chipcards, passports and identification cards and devices; networks and peripherals; defense devices and systems; Internet systems and terminals, including payment systems; and others as mentioned elsewhere herein and/or appreciated by those skilled in the art.

Advantages presented by embodiments include better diagnostic coverage, better data for making comparisons, detectability of common signal path faults, and power savings over convention solutions that use time-delayed identical copies. The automatic generation of the diverse processing core also presents significant time and cost advantages over manual, bespoke generation while providing maximal diversity.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, implantation locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

The invention claimed is:

1. A logic-based computing system comprising:
    a first processing core;
    a second processing core generated from the first processing core and comprising an inverted logical equivalent of the first processing core such that an output of the second processing core is a complement of an output of the first processing core; and
    comparator logic coupled to receive the outputs of the first and second processing cores as inputs and provide an error output if the output of the second processing core is not the complement of the output of the first processing core.

2. The system of claim 1, wherein the second processing core is automatically generated from the first processing core.

3. The system of claim 1, wherein the second processing core is generated from the first processing core by processing a logical description of the first processing core before or during logic synthesis of the logical description.

4. The system of claim 3, wherein the logical description is VHDL or Verilog.

5. The system of claim 1, wherein an input of the second processing core is a double-inversion of an of the first processing core.

6. The system of claim 1, wherein the first processing core and the second processing core each comprise a state register, and wherein an input, an output and a reset state of the state register of the second processing core are inverted relative to an input, an output and a reset state of the state register of the first processing core.

7. The system of claim 1, wherein a logic implementation of the second processing core is an inverse of a logic implementation of the first processing core.

8. The system at claim 1, wherein a clock signal of the second processing core is inverted with respect to a clock signal of the first processing core.

9. The system of claim 1, wherein an output of the second processing core is inverted with respect to an output of the first processing core.

10. The system of claim 1, wherein the first and second processing cores are selected from the group consisting of a microprocessor, a co-processor, a peripheral, a memory controller, a digital signal processor, a communication interface and a graphics engine.

11. An integrated circuit comprising:
    a first microprocessor having an output;
    a second microprocessor created from the first microprocessor and comprising an inverted logical equivalent of the first microprocessor, the second microprocessor having an output; and a comparator circuit coupled to the output of the first microprocessor and the output of the second microprocessor and configured to compare the outputs and provide an error output if the output of the second microprocessor core is not the complement of the output of the first microprocessor core.

12. The integrated circuit of claim 11, comprising at least one inverter at an input of the second microprocessor.

13. The integrated circuit of claim 12, comprising two inverters at the input of the second microprocessor.

14. The integrated circuit of claim 11, wherein the first microprocessor and the second microprocessor each comprise at least one state register, and wherein the second microprocessor comprises an inverter at each of an input and an output of the at least one state register.

15. The integrated circuit of claim 14, wherein a reset state of the at least one state register of the second microprocessor is inverted with respect to a reset state of the at least one state register of the first microprocessor.

16. The integrated circuit of claim 11, wherein a logic implementation of the second microprocessor is an inverse of a logic implementation of the first microprocessor.

17. The integrated circuit of claim 11, wherein a clock signal line of the second microprocessor core comprises an inverter.

18. The integrated circuit of claim 11, comprising an inverter at an output of the second microprocessor.

19. A computer-implemented method of creating a diverse logical block for a processor or comprising:
creating a high-level language description of a logical block of a processor; and
for a first instance of the language description,
performing a first logic synthesis of the language description and executing a diverse microprocessor-generating script,
performing a second logic synthesis and optimization,
generating a logic gate-level netlist, and
generating a technology-specific physical layout of a first logical block of a processor.

20. The method of claim 19, further comprising:
for a second instance of the language description,
performing a first logic synthesis of the language description,
performing a second logic synthesis and optimization,
generating a logic gate-level netlist, and
generating a technology-specific physical layout of a second logical block of a processor.

21. The method of claim 20, further comprising performing a diversity check between the first and second instances after generating the logic gate-level netlists.

22. The method of claim 19, further comprising creating an original processor and a diverse processor, the diverse processor being an inverted logical equivalent of the original processor.

23. The method of claim 19, further comprising defining the diverse processor-generating script.

24. The method of claim 19, wherein the high-level language description comprises a register transfer level (RTL) description.

25. A method of real-time error detection in a processor comprising:
executing an instruction by a first processor;
executing an instruction by a second processor created from the first processor;
comparing is result of the first processor and the second processor; and
detecting an error lithe result of the second processor is not the complement of the first processor.

26. The method of claim 25, wherein the second processor is an inverted logical equivalent of the first processor.

27. The method of claim 25, wherein executing an instruction by a second processor is carried out automatically.

* * * * *

UNITED STATES PATENT AND TRADEMARK OFFICE
CERTIFICATE OF CORRECTION

PATENT NO. : 8,516,356 B2  
APPLICATION NO. : 12/839503  
DATED : August 20, 2013  
INVENTOR(S) : Brewerton et al.

Page 1 of 1

It is certified that error appears in the above-identified patent and that said Letters Patent is hereby corrected as shown below:

In the Claims

Column 9, Line 29:  
Delete "or".

Column 10, Line 28:  
Delete "is" and insert --a--.

Column 10, Line 30:  
Delete "lithe" and insert --if the--.

Signed and Sealed this  
Tenth Day of December, 2013

Margaret A. Focarino  
*Commissioner for Patents of the United States Patent and Trademark Office*